(12) United States Patent
Chen et al.

(10) Patent No.: US 7,778,039 B2
(45) Date of Patent: Aug. 17, 2010

(54) SUBSTRATES, SYSTEMS, AND DEVICES INCLUDING STRUCTURES FOR SUPPRESSING POWER AND GROUND PLANE NOISE, AND METHODS FOR SUPPRESSING POWER AND GROUND PLANE NOISE

(75) Inventors: Houfei Chen, Boise, ID (US); Shiyou Zhao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 573 days.

(21) Appl. No.: 11/430,540

(22) Filed: May 8, 2006

(65) Prior Publication Data
US 2007/0258173 A1  Nov. 8, 2007

(51) Int. Cl.
*H05K 1/18* (2006.01)
(52) U.S. Cl. .............. 361/763; 361/780; 361/761; 361/794; 361/301.1; 361/306.2; 361/306.3
(58) Field of Classification Search ............. 361/794, 361/734, 766, 780, 761, 763, 795, 299.1, 361/298.2, 301.1, 301.4, 306.2, 306.3, 728, 361/738, 748, 762, 783, 42
See application file for complete search history.

(56) References Cited

U.S. PATENT DOCUMENTS

| | | | |
|---|---|---|---|
| 5,131,140 A | | 7/1992 | Zimmer |
| 5,926,377 A | * | 7/1999 | Nakao et al. ............... 361/763 |
| 6,385,565 B1 | | 5/2002 | Anderson et al. |
| 6,721,195 B2 | | 4/2004 | Brunelle et al. |
| 6,789,241 B2 | | 9/2004 | Anderson et al. |
| 6,850,878 B2 | | 2/2005 | Smith et al. |
| 6,970,341 B1 | * | 11/2005 | Devoe et al. ............... 361/303 |
| 7,342,471 B2 | * | 3/2008 | McKinzie, III ............. 333/219 |
| 2005/0104678 A1 | * | 5/2005 | Shahparnia et al. .......... 333/12 |
| 2005/0168238 A1 | * | 8/2005 | Wu et al. ...................... 326/27 |
| 2006/0108690 A1 | * | 5/2006 | Wu et al. ..................... 257/758 |
| 2006/0133055 A1 | * | 6/2006 | Uematsu et al. ............ 361/760 |
| 2006/0274478 A1 | * | 12/2006 | Chen et al. ................. 361/313 |
| 2007/0001926 A1 | * | 1/2007 | Waltho ....................... 343/909 |

OTHER PUBLICATIONS

Kim, Joong-Ho, et al., "Modeling of Irregular Shaped Power Distribution Planes Using Transmission Matrix Method," IEEE Transactions on Advanced Packaging, vol. 24, No. 3, pp. 334-346, Aug. 2001.
Miller, Jason R., "The Impact of Split Power Planes on Package Performance," IEEE, 2001 Electronic Components and Technology Conference, 5 pages, 2001.

* cited by examiner

*Primary Examiner*—Dameon E Levi
*Assistant Examiner*—Hoa C Nguyen
(74) *Attorney, Agent, or Firm*—TraskBritt

(57) ABSTRACT

Substrates having power and ground planes, such as, for example, printed circuit boards, include at least one noise suppression structure configured to suppress electrical waves propagating through at least one of a power plane and a ground plane. The noise suppression structure may include a power plane extension that extends from the power plane generally toward the ground plane, and a ground plane extension that extends from the ground plane generally toward the power plane. The ground plane extension may be separated from the power plane extension by a distance that is less than the distance separating the power and ground planes. Electronic device assemblies and systems include such substrates. Methods for suppressing noise in at least one of a power plane and a ground plane include providing such noise suppression structures between power and ground planes.

39 Claims, 8 Drawing Sheets

SUBSTRATES, SYSTEMS, AND DEVICES INCLUDING STRUCTURES FOR SUPPRESSING POWER AND GROUND PLANE NOISE, AND METHODS FOR SUPPRESSING POWER AND GROUND PLANE NOISE

BACKGROUND OF THE INVENTION

1. Field of the Invention

The present invention relates to electronic devices and electronic device assemblies that have a substrate including a power plane and a ground plane, such as, for example, a printed circuit board. More particularly, the present invention relates to methods for suppressing noise in at least one of a power plane and a ground plane of a substrate, to substrates that include noise suppression structures configured to suppress electrical waves propagating through at least one of a power plane and a ground plane of the substrate, and to electronic device assemblies that include such substrates.

2. Discussion of Related Art

In the field of electronic devices and systems, individual devices or components are both structurally and electrically assembled using substantially planar structures that include conductive elements, such as traces, terminals, and vias, some of which are electrically isolated from others by a dielectric material.

For example, in a computer system, a microprocessor and a memory module each may be electrically and structurally coupled to a printed circuit board (i.e., a motherboard). The microprocessor and the memory module may communicate electrically with one another through conductive elements (e.g., traces, terminals, and vias) of the printed circuit board. In addition, the memory module itself may include a relatively smaller printed circuit board to which one or more semiconductor device packages may be both electrically and structurally coupled. This relatively smaller printed circuit board of the memory module may be configured to provide electrical communication between the one or more semiconductor device packages that are structurally and electrically coupled thereto and the motherboard of the computer system through conductive elements (e.g., vias, traces, and terminals) of the relatively small printed circuit board. Furthermore, each semiconductor device package of the memory module may include yet another printed circuit board (e.g., interposer substrate), which may be smaller than both the printed circuit board of the memory module and the motherboard of the computer system.

Substantially planar substrates that are used to both electrically and structurally couple together one or more electronic devices or components often include planar layers of electrically conductive material (i.e., planar conductors) separated by layers of dielectric material. A portion of at least some of the conductive layers may be patterned to form electrically conductive traces, which typically extend generally parallel to the plane of the substrate. Conductive traces formed in different layers may be electrically coupled using conductive vias, which typically extend generally perpendicular to the plane of the substrate. Furthermore, at least one planar layer of electrically conductive material may be configured as a "power plane," and at least one planar layer of electrically conductive material may be configured as the "ground plane."

In high-speed digital electronic systems, the performance of the power delivery system continues to play an ever-increasing role in the overall performance of the electrical system. Signals in digital electronic systems typically carry information by alternating between a high voltage level (which may be defined by the voltage of the power plane of a printed circuit board) and a low voltage level (which may be defined by the voltage of the ground plane of a printed circuit board).

An important aspect of the performance of a power delivery system of an electronic system is "power coupling." Power coupling is a phenomenon that occurs when the consumption of power by one or more devices of the electronic system causes fluctuation in power consumption by another device of the electronic system. For example, in a memory module that includes n number of semiconductor device packages, in a worst case scenario, n−1 semiconductor device packages may switch to a power consumption mode substantially simultaneously. This simultaneous switching of devices may generate propagating waves in the power and/or ground plane. These propagating waves may cause a temporary, but significant, drop in the voltage of the power plane at the location of the one remaining semiconductor device package. These propagating electrical waves in the power and/or ground plane caused by the simultaneous switching of devices may be referred to as simultaneous switching noise (SSN).

Devices of an electronic system that generate simultaneous switching noise may be referred to as "aggressor" or "aggressive" devices, while devices of an electronic system that are affected by simultaneous switching noise may be referred to as "victim" devices.

Simultaneous switching noise may cause victim devices to fail to function correctly. Therefore, a power delivery system should suppress such power coupling as much as possible so as to achieve "power isolation" between the various power consuming devices or components of an electronic system, thereby minimizing the occurrence of simultaneous switching noise in the power delivery system. This principle may be especially important as the number of power consuming devices or components increases for a given electronic system. Moreover, as the operating frequency of an electronic device increases into the gigahertz (GHz) range, the power delivery system of the electronic device may be required to retain a high level of power isolation between components over a broad range of frequencies. For example, for an electronic device that is configured to operate at a frequency of 3.2 GHz, it may be necessary or desirable to ensure a satisfactory level of power isolation between the individual components of the device over a range of frequencies extending up to about 9.6 GHz, which corresponds to the third harmonic of the operating frequency.

Two general methods for achieving power isolation between the various power consuming devices or components of an electronic system have been presented in the art. The first method for achieving power isolation between the various power consuming devices or components of an electronic system may be referred to as the "split plane" method. Briefly, the split plane method involves forming "gaps" or "splits" in the power plane and/or the ground plane. These splits may be disposed between the various power consuming devices or components of an electronic system. The split plane method is described in, for example, U.S. Pat. No. 5,131,140 to Zimmer, Jason R. Miller, *The Impact of Split Power Planes On Package Performance,* 2001 IEEE Electronic Components and Technology Conference, and Joong-Ho Kim & Madhavan Swaminathan, *Modeling of Irregular Shaped Power Distribution Planes Using Transmission Matrix Method,* IEEE Transactions On Advanced Packaging, Volume 24, no. 3, August 2001. The split plane method, however, may negatively affect the integrity of electrical signals carried by conductive traces that extend over or under a split in the power and/or ground plane. For example, plane splits may cause signal reflection or generate resonance in traces that extend over or under a split in the power and/or ground plane. Furthermore, plane splits may increase crosstalk between adjacent traces that extend over or under a split in the power and/or ground plane.

The second method for achieving power isolation between the various power consuming devices or components of an electronic system may be referred to as the "bypass capacitor" method. Briefly, the bypass capacitor method involves providing bypass capacitors between the power plane and the ground plane at selected locations on a printed circuit board to suppress simultaneous switching noise. The bypass capacitor method is described in, for example, U.S. Pat. No. 6,385,565 to Anderson et al., U.S. Pat. No. 6,789,241 to Anderson et al., and U.S. Pat. No. 6,850,878 to Smith et al. In the bypass capacitor method, however, each bypass capacitor may be effective only over a narrow range of frequencies. Therefore, a large number of bypass capacitors may be required to suppress simultaneous switching noise over a broad range of frequencies. Furthermore, the performance of bypass capacitors may be relatively limited at higher frequencies.

In view of the above, it would be desirable to provide methods for suppressing simultaneous switching noise in power and/or ground planes over broad ranges of frequencies (including relatively high frequencies) while minimizing any negative affect to the integrity of electrical signals carried by traces extending parallel to the power and/or ground planes.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENTS

Figure 1A:
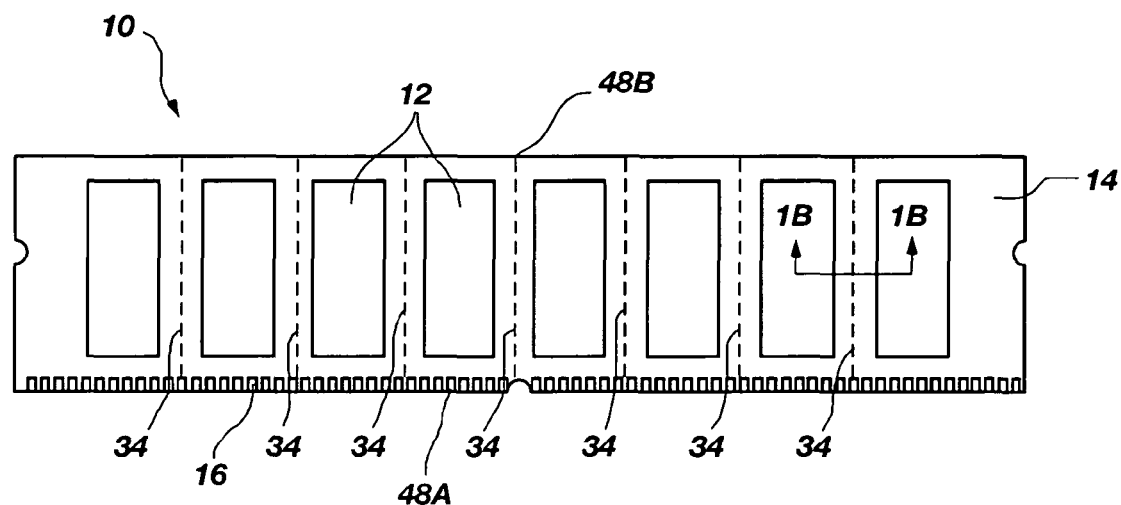
FIG. 1A is a side view of a memory module that includes a substrate having a plurality of noise suppression structures configured to suppress noise in at least one of a power plane and a ground plane of the substrate.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

In one aspect, the present invention includes substrates that can be used for structurally and electrically coupling together components of an electronic device or system, and that include one or more noise suppression structures disposed between a power plane and a ground plane. The noise suppression structures may be configured to suppress electrical waves propagating through at least one of the power plane and the ground plane. The noise suppression structures may include a power plane extension that extends from the power plane toward the ground plane, and a ground plane extension that extends from the ground plane toward the power plane. The power plane extension may be disposed within the substrate proximate to the ground plane extension. In some embodiments, the power plane extension and the ground plane extension may be substantially planar, and may be separated from one another by a distance that is less than a distance separating the power plane from the ground plane. Furthermore, the substrate may include a printed circuit board. Such substrates can be used in virtually any electronic device or system.

In additional aspects, the present invention includes electronic device assemblies and systems that include at least two semiconductor devices structurally and electrically coupled to a substrate that includes a power plane, a ground plane, and a noise suppression structure disposed between the power plane and the ground plane. In some embodiments of the invention, at least a portion of the noise suppression structure may be located between the at least two semiconductor devices. Furthermore, in some embodiments, the power plane extension may be directly electrically coupled only to the power plane, and the ground plane extension may be directly electrically coupled only to the ground plane.

In yet another aspect, the present invention includes methods of suppressing noise in at least one of a power plane and a ground plane of a substrate. The methods include providing a noise suppression structure between the power plane and the ground plane of the substrate. To provide a noise suppression structure between the power plane and the ground plane of a substrate, a power plane extension may be provided that extends from the power plane generally toward the ground plane, and a ground plane extension may be provided that extends from the ground plane generally toward the power plane.

Figure 1B:
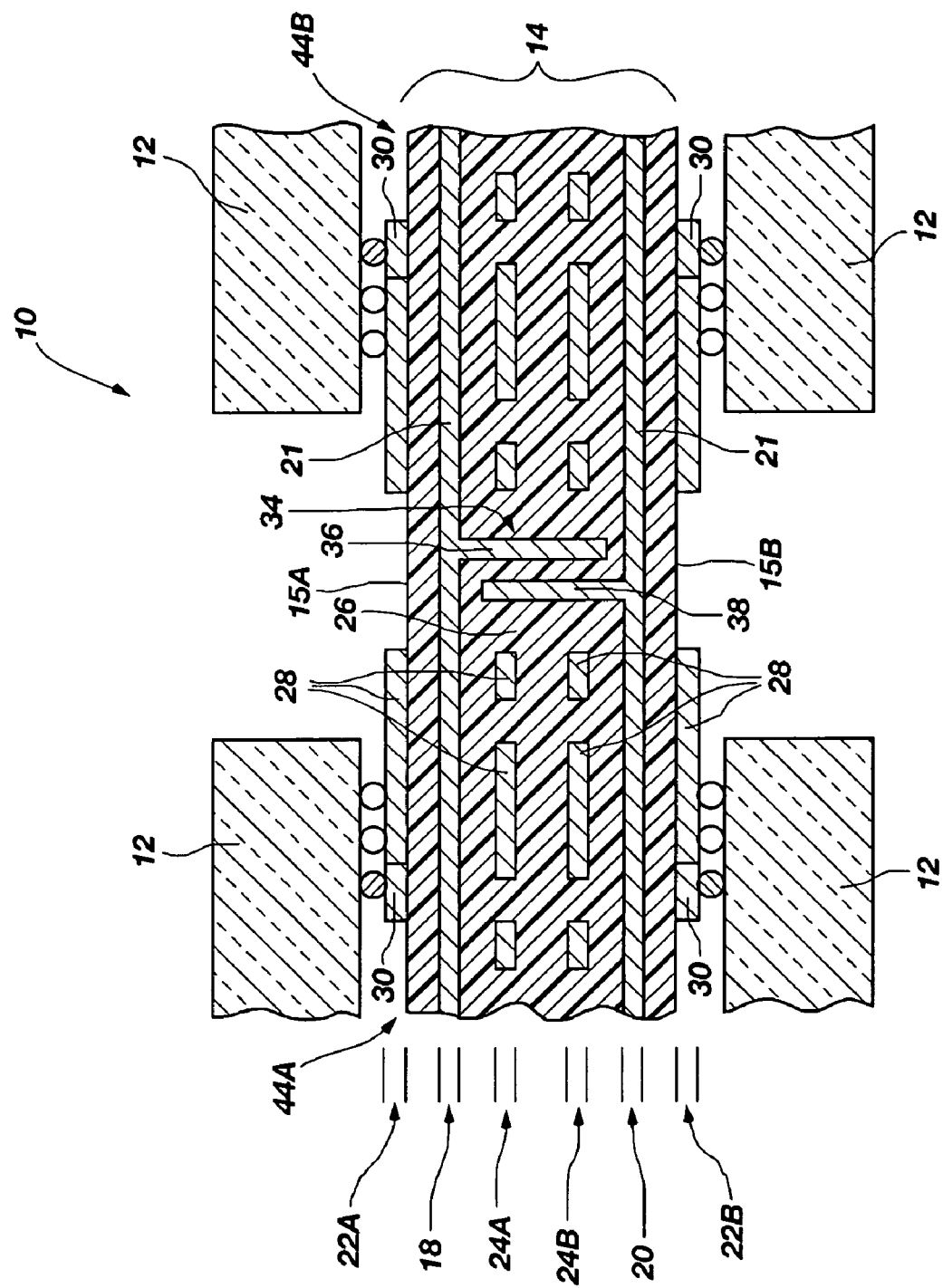
FIG. 1B is an enlarged partial cross-sectional view of the memory module shown in FIG. 1A illustrating a noise suppression structure thereof.
Figure 1C:
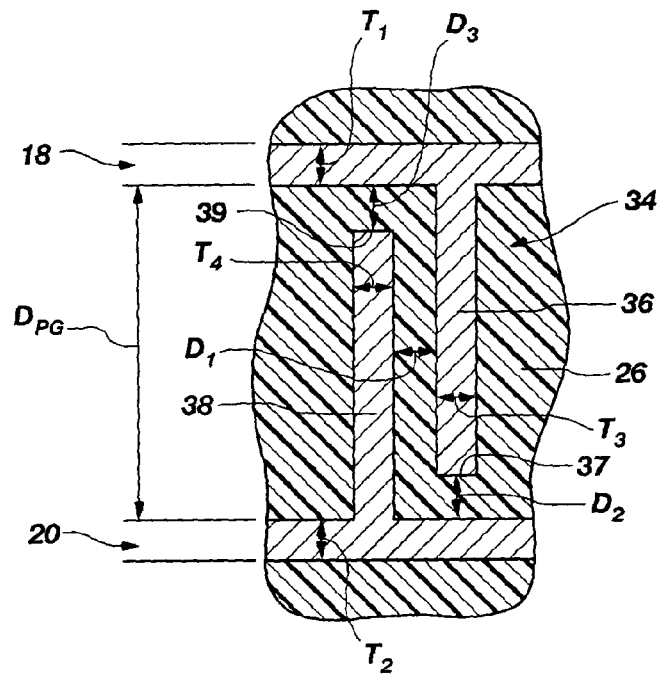
FIG. 1C is an enlarged view of a portion of FIG. 1B further illustrating various aspects of the noise suppression structure shown therein.

A memory module 10 that embodies teachings of the present invention is shown in FIGS. 1A-1C. Referring to FIG. 1A, the memory module 10 includes a plurality of semiconductor devices 12, each of which is structurally and electrically coupled to a substantially planar substrate 14. Each semiconductor device 12 may include a memory package having one or more semiconductor dice (not shown), each of which may include an integrated circuit configured to store data. The memory module 10 may include a plurality of electrical contacts 16, each of which may be configured to communicate electrically with an integrated circuit of one or more of the semiconductor devices 12. The electrical contacts 16 may be used to electrically couple the memory module 10 to a higher level substrate (not shown in FIG. 1A), such as the motherboard of a computer system.

Referring to FIG. 1B, the substrate 14 may include a printed circuit board, and may include a plurality of layers or planes. By way of example and not limitation, the substrate 14 may include a power plane 18 and a ground plane 20, each of which may include a substantially planar layer of conductive material 21. The substrate 14 may further include one or more signal planes, each of which may include a plurality of conductive signal lines or traces 28 (extending generally parallel to the plane of the substrate 14) and a plurality of conductive pads or terminals 30. For example, the substrate 14 may include a first surface signal plane 22A disposed adjacent a first major surface 15A of the substrate 14, a second surface signal plane 22B disposed adjacent a second major surface 15B of the substrate 14, a first internal signal plane 24A disposed between the power plane 18 and the ground plane 20, and a second internal signal plane 24B disposed between the power plane 18 and the ground plane 20. A dielectric material 26 may be disposed between each of these planes so as to substantially electrically isolate each of these planes from the others. By way of example and not limitation, the dielectric material 26 may include FR-4, FR-5, polyimide, bismaleimide triazine, or any other dielectric material suitable for use in a printed circuit board.

In additional embodiments, the substrate 14 may include only one signal plane instead of a plurality of signal planes. By way of example and not limitation, in some embodiments, the substrate 14 may include only the first surface signal plane 22A and the second surface signal plane 22B and not the first internal signal plane 24A and the second internal signal plane 24B. Furthermore, the substrate 14 may include any number of power planes 18 and ground planes 20.

As seen in FIG. 1B, the memory module 10 may include a plurality of semiconductor devices 12 mounted to each of the first major surface 15A and the second major surface 15B of the substrate 14, in a conventional dual in-line memory module (DIMM) configuration. In additional embodiments, the memory module 10 may include a plurality of semiconductor devices 12 mounted on only one of the first major surface 15A and the second major surface 15B of the substrate 14, in a conventional single in-line memory module (SIMM) configuration.

Furthermore, by way of example and not limitation, the memory module 10 may be configured to include any type of random access memory (RAM). For example, the memory module 10 may be configured to include static RAM (SRAM), dynamic RAM (DRAM), synchronous DRAM (SDRAM), Rambus DRAM (RDRAM), extended data out (EDO) RAM, double data rate (DDR) RAM, or any other type of RAM. In still additional embodiments, the memory module 10 may include any type of flash memory, and may be configured as secure digital (SD) memory module, a mini secure digital (miniSD) memory module, a compact flash (CF) memory module, etc.

The substantially planar memory module 10 also may include one or more noise suppression structures 34. Each noise suppression structure 34 may be configured to suppress electrical waves or noise propagating through at least one of the power plane 18 and the ground plane 20. Furthermore, each noise suppression structure 34 may be configured to suppress electrical waves over a range of frequencies. By way of example and not limitation, each noise suppression structure 34 may be configured to suppress electrical waves propagating through at least one of the power plane 18 and the ground plane 20 by absorbing and/or reflecting such electrical waves.

Each noise suppression structure 34 may include a power plane extension 36 that extends from the power plane 18 into the dielectric material 26 generally toward the ground plane 20, and a ground plane extension 38 that extends from the ground plane 20 into the dielectric material 26 generally toward the power plane 18. The power plane extension 36 and the ground plane extension 38 of each noise suppression structure 34 may be substantially electrically isolated from conductive signal lines or traces, thermals, and vias of the substrate 14. In other words, the power plane extension 36 may be directly electrically coupled only to the power plane 18, and the ground plane extension 38 of each noise suppression structure 34 may be directly electrically coupled only to the ground plane 20.

By way of example and not limitation, the power plane extension 36 and the ground plane extension 38 of each noise suppression structure 34 each may include a substantially planar member comprising a conductive material. Furthermore, the power plane extension 36 may be oriented substantially perpendicular to the power plane 18, the ground plane extension 38 may be oriented substantially perpendicular to the ground plane 20, and the power plane extension 36 and the ground plane extension 38 may be oriented substantially parallel to one another. In this configuration, the power plane extension 36 and the ground plane extension 38 of each noise suppression structure 34 may comprise a pair of substantially parallel plates, one plate being electrically coupled to the power plane 18 and one plate being electrically coupled to the ground plane 20.

In additional embodiments, the power plane extension 36 and the ground plane extension 38 of each noise suppression structure 34 may not be substantially planar, and each may extend along a curved path through the substrate 14.

As seen in FIG. 1B, the noise suppression structure 34 shown therein may be disposed between a first region 44A of the substrate 14 (shown on the left hand side of FIG. 1B) and a second region 44B of the substrate 14 (shown on the right hand side of FIG. 1B). At least one semiconductor device 12 may be mounted to the first region 44A of the substrate 14 on the first major surface 15A, and at least one semiconductor device 12 may be mounted to the first region 44A of the substrate 14 on the second major surface 15B. Similarly, at least one semiconductor device 12 may be mounted to the second region 44B of the substrate 14 on the first major surface 15A, and at least one semiconductor device 12 may be mounted to the second region 44B of the substrate 14 on the second major surface 15B. Each semiconductor device 12 may be interconnected at one or more locations to at least one of the power plane 18 and the ground plane 20.

FIG. 1C is an enlarged view of the noise suppression structure 34 shown in FIG. 1B. As seen in FIG. 1C, the power plane 18 may have a thickness $T_1$, the ground plane 20 may have a thickness $T_2$, the power plane extension 36 may have a thickness $T_3$, the ground plane extension 38 may have a thickness $T_4$. The power plane extension 36 and the ground plane extension 38 may be separated from one another by a distance $D_1$, which may be less than a distance $D_{PG}$ between the power plane 18 and the ground plane 20. Moreover, the distance $D_1$ may be substantially uniform across the noise suppression structure 34, or the distance $D_1$ may be varied across the noise suppression structure 34. Furthermore, an end or edge 37 of the power plane extension 36 may be separated from the ground plane 20 by a distance $D_2$, and an end or edge 39 of the ground plane extension 38 may be separated from the power plane 18 by a distance $D_3$. Additionally, the distance $D_2$ may define the shortest distance between the power plane extension 36 and the ground plane 20, and the distance $D_3$ may define the shortest distance between the ground plane extension 38 and the power plane 18.

By way of example and not limitation, the distance $D_1$ may be in a range extending from about 0.01 millimeter to about 0.15 millimeter. In some embodiments, the thickness $T_3$ of the power plane extension 36 may be substantially equal to the thickness $T_1$ of the power plane 18, and the thickness $T_4$ of the ground plane extension 38 may be substantially equal to the thickness $T_2$ of the ground plane 20. Furthermore, the thickness $T_3$ of the power plane extension 36 may be substantially equal to the thickness $T_4$ of the ground plane extension 38. For example, the thickness $T_3$ of the power plane extension 36 and the thickness $T_4$ of the ground plane extension 38 each may be in a range extending from about 0.01 millimeter to about 0.15 millimeter. Additionally, the distance $D_2$ between the power plane extension 36 and the ground plane 20 and the distance $D_3$ between the ground plane extension 38 and the power plane 18 each may be less than about 0.15 millimeter.

Referring back to FIG. 1A, the substrate 14 of the memory module 10 may include a plurality of noise suppression structures 34 (FIG. 1B), the location of each of which is represented in FIG. 1A by a dashed line. In one embodiment, each noise suppression structure 34 may extend substantially entirely across the substrate 14 from a first major side 48A thereof to a second major side 48B thereof. In this configuration, each noise suppression structure 34 may be configured to substantially prevent noise that originates in regions of the substrate 14 on one side of a noise suppression structure 34 from propagating to regions of the substrate 14 on the opposite side of the noise suppression structure 34. In additional embodiments, the memory module 10 may include a plurality of noise suppression structures 34 between at least two adjacent semiconductor devices 12. Furthermore, the memory module 10 may not include any noise suppression structures 34 between one or more pairs of adjacent semiconductor devices 12. Moreover, while each of the noise suppression structures 34 of the memory module 10 may be substantially structurally identical, the invention is not so limited, and the memory module 10 may include a plurality of structurally different noise suppression structures 34, as will be described in further detail below.

Commercially available three-dimensional electromagnetic field simulation software may be used to calculate, estimate, or otherwise predict the ability of each noise suppression structure 34 of the memory module 10 to suppress electrical waves propagating through at least one of the power plane 18 and the ground plane 20. For example, software sold under the name HIGH FREQUENCY STRUCTURE SIMULATOR (HFSS) by Ansoft Corporation of Pittsburgh, Pa. may be used to calculate, estimate, or predict the ability of each noise suppression structure 34 of the memory module 10 to suppress electrical waves propagating through at least one of the power plane 18 and the ground plane 20. A computational model of the memory module 10 may be created and used in conjunction with such software to calculate the voltage (or other electrical characteristic) at a first location in at least one of the power plane 18 and the ground plane 20 as the voltage (or other electrical characteristic) is selectively varied at a second location in at least one of the power plane 18 and the ground plane 20 over a range of frequencies extending from about zero hertz (direct current) to about ten or more gigahertz. The first location may be on a side of at least one noise suppression structure 34 that is opposite from the second location. This process may be repeated as necessary to simulate the operating conditions of each of the semiconductor devices 12 mounted to the substrate 14.

The ability of the noise suppression structures 34 of the memory module 10 to suppress electrical waves propagating through at least one of the power plane 18 and the ground plane 20 may be selectively optimized by selectively varying the location, shape, size, and orientation of each of the noise suppression structures 34 of the memory module 10 in the computational model used in conjunction with the commercially available three-dimensional electromagnetic field simulation software as described above, and using the commercially available three-dimensional electromagnetic field simulation software to calculate, estimate, or predict the ability of each noise suppression structure 34 of the memory module 10 to suppress electrical waves propagating through at least one of the power plane 18 and the ground plane 20 as the configurations of the noise suppression structures 34 are varied in the manner previously described.

Referring again to FIG. 1C, by way of example and not limitation, one or more of the thickness $T_3$ of the power plane extension 36, the thickness $T_4$ of the ground plane extension, the distance $D_1$ between the power plane extension 36 and the ground plane extension 38, the distance $D_2$ between the power plane extension 36 and the ground plane 20, and the distance $D_3$ between the ground plane extension 38 and the power plane 18 may be selectively varied in one or more of the noise suppression structures 34 of the memory module 10 in the computational model while calculating, estimating, or predicting the ability of each noise suppression structure 34 of the memory module 10 to suppress electrical waves propagating through at least one of the power plane 18 and the ground plane 20 using the commercially available three-dimensional electromagnetic field simulation software. This process may be continued as necessary until the performance of the noise suppression structures 34 of the memory module 10 has been selectively optimized over a desired range of frequencies under selected or predicted operating conditions of the memory module 10.

The noise suppression structures 34 described herein may be capable of reducing noise propagating through at least one of the power plane 18 and the ground plane 20 such that power coupling between aggressive semiconductor devices 12 and victim semiconductor devices 12 is reduced by anywhere from a few to forty or more decibels. Furthermore, the ability of the noise suppression structures 34 described herein to suppress noise propagating through at least one of the power plane 18 and the ground plane 20 may be enhanced at relatively higher frequencies (e.g., frequencies greater than about five gigahertz).

In some embodiments, each noise suppression structure 34 of the memory module 10 may be substantially identical and configured to suppress noise propagating through at least one of the power plane 18 and the ground plane 20 with substantially the same effectiveness over a range of frequencies. In additional embodiments, the memory module 10 may include a plurality of noise suppression structures 34, at least one or more of which differs from at least one other noise suppression structure 34 with respect to the ability of the noise suppression structure 34 to suppress noise over a particular range of frequencies.

Figure 2:
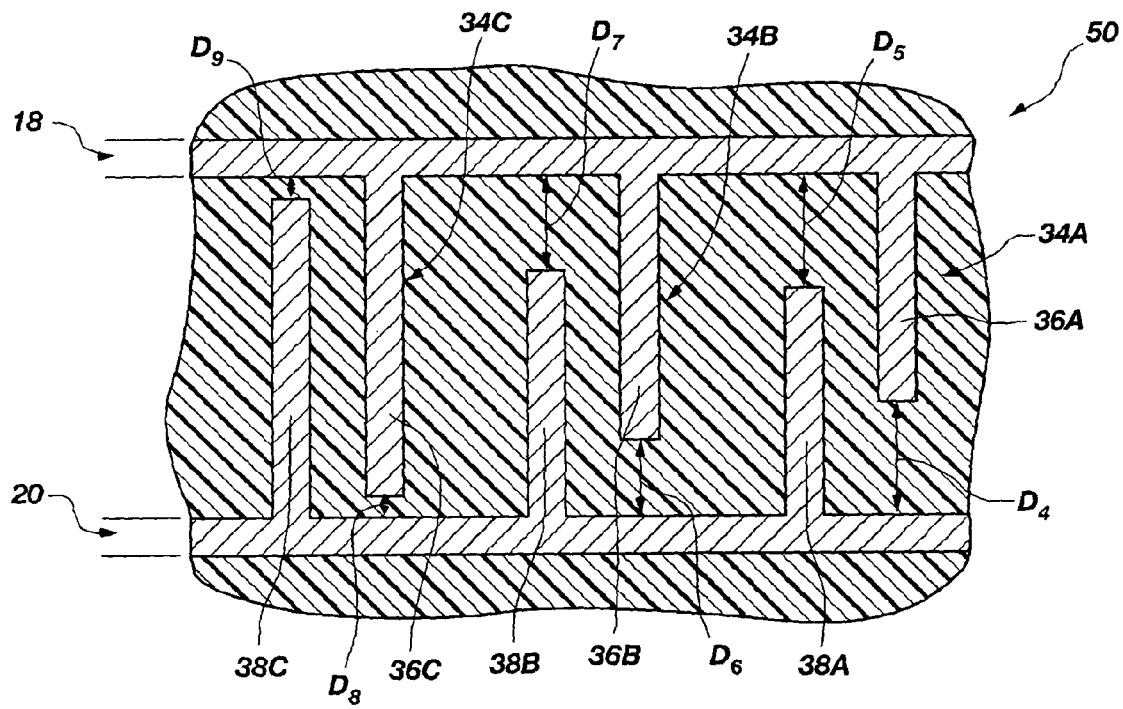
FIG. 2 is an enlarged view of a portion of a substrate that includes a plurality of noise suppression structures, each of which is configured to suppress noise in at least one of a power plane and a ground plane of the substrate over a different range of frequencies.

For example, FIG. 2 is an enlarged partial view of another substrate 50 that may be used in an electronic device, such as, for example, the memory module 10 shown in FIGS. 1A-1C.

As seen in FIG. 2, the substrate may include a power plane 18, a ground plane 20, and a plurality of noise suppression structures, each of which may be configured to suppress noise propagating through at least one of the power plane 18 and the ground plane 20.

By way of example and not limitation, the substrate 50 may include a first noise suppression structure 34A, a second noise suppression structure 34B, and a third noise suppression structure 34C. The first noise suppression structure 34A may include a power plane extension 36A and a ground plane extension 38A, the second noise suppression structure 34B may include a power plane extension 36B and a ground plane extension 38B, and the third noise suppression structure 34C may include a power plane extension 36C and a ground plane extension 38C.

Each of the noise suppression structures 34A, 34B, 34C may differ in at least one characteristic (e.g., size, shape, orientation, etc.) with respect to the other of the noise suppression structures 34A, 34B, 34C such that each noise suppression structure 34A, 34B, 34C exhibits noise suppression characteristics that are different from the other noise suppression structures 34A, 34B, 34C. In other words, theoretically, if one were to introduce electrical waves (i.e., noise) on one side of a noise suppression structure 34A, 34B, 34C while measuring the electrical waves on an opposite side of that noise suppression structure 34A, 34B, 34C and selectively varying the frequency of the introduced electrical waves over a range of frequencies (such as, for example, from direct current to 10 GHz), one could plot the difference between the voltage of the introduced electrical waves and the voltage of the measured electrical waves over the range of frequencies. By varying at least one characteristic of the noise suppression structures 34A, 34B, 34C, each noise suppression structure 34A, 34B, 34C may be configured so as to generate a unique plot over the range of frequencies.

By providing a plurality of different noise suppression structures 34A, 34B, 34C, each of which is configured to be particularly effective at suppressing electrical noise over a different range of frequencies, the noise suppression structures 34A, 34B, 34C collectively may be configured to suppress electrical noise propagating through at least one of the power plane 18 and the ground plane 20 over a relatively broad range of frequencies.

By way of example and not limitation, it may be possible to vary the noise suppression characteristics of each of the noise suppression structures 34A, 34B, 34C by varying the distances between the power plane extensions 36A, 36B, 36C and the ground plane 20 and the distances between the ground plane extensions 38A, 38B, 38C and the power plane 18. For example, the power plane extension 36A may be separated from the ground plane 20 by a distance $D_4$, the power plane extension 36B may be separated from the ground plane 20 by a distance $D_6$, and the power plane extension 36C may be separated from the ground plane 20 by a distance $D_8$. Each of the distances $D_4$, $D_6$, $D_8$ may differ from one another.

By way of example and not limitation, the distance $D_4$ may be greater than the distance $D_6$, and the distance $D_6$ may be greater than the distance $D_8$. Similarly, the ground plane extension 38A may be separated from the power plane 18 by a distance $D_5$, the ground plane extension 38B may be separated from the power plane 18 by a distance $D_7$, and the ground plane extension 38C may be separated from the power plane 18 by a distance $D_9$. Each of the distances $D_5$, $D_7$, $D_9$ may differ from one another. By way of example and not limitation, the distance $D_5$ may be greater than the distance $D_7$, and the distance $D_7$ may be greater than the distance $D_9$. In some embodiments, the distance $D_4$ may be substantially equal to the distance $D_5$, the distance $D_6$ may be substantially equal to the distance $D_7$, and the distance $D_8$ may be substantially equal to the distance $D_9$.

In additional embodiments, the noise suppression structures 34A, 34B, 34C may be configured to exhibit varied noise suppression characteristics by varying features or characteristics of the noise suppression structures 34A, 34B, 34C other than the distances $D_1$-$D_9$. With combined reference to FIGS. 1C and 2, any one or more of the distance $D_1$ between the power plane extension 36 and the ground plane extension 38, the distance $D_2$ between the power plane extension 36 and the ground plane 20, the distance $D_3$ between the ground plane extension 38 and the power plane 18, the thickness $T_3$ of the power plane extension 36, and the thickness $T_4$ of the ground plane extension 38 may be selectively varied for each of the noise suppression structures 34A, 34B, 34C shown in FIG. 2 such that each exhibits different noise suppression characteristics. Any other feature or characteristic of the noise suppression structures 34A, 34B, 34C also may be varied such that the noise suppression structures 34A, 34B, 34C are configured to exhibit differing noise suppression characteristics.

An illustrative example of a method that may be used to provide a noise suppression structure 34 in a substrate 14 such as, for example, a printed circuit board, will now be described with reference to FIGS. 3A-3D.

Figure 3A:
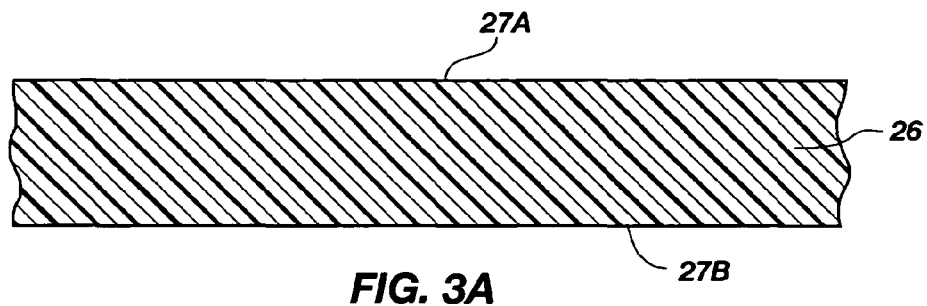
FIGS. 3A-3D illustrate one example of a method that may be used to form a noise suppression structure in a substrate.

Referring to FIG. 3A, a generally planar layer of dielectric material 26 having a first major surface 27A and a second major surface 27B may be provided. In some embodiments, the generally planar layer of dielectric material 26 may include internal signal layers, such as the signal planes 24A, 24B previously described herein in reference to FIG. 1B.

Figure 3B:
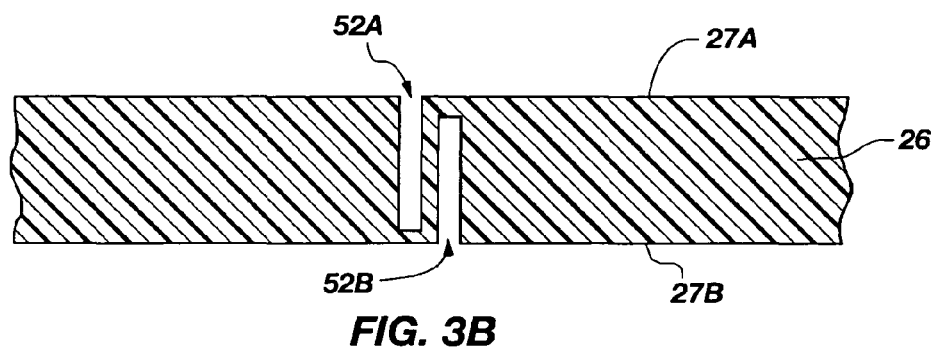

As shown in FIG. 3B, a first trench or void 52A may be formed in the first major surface 27A of the layer of dielectric material 26, and a second trench or void 52B may be formed in the second major surface 27B of the layer of dielectric material 26. The first void 52A may have a size and shape configured to define the size and shape of a power plane extension 36, and the second void 52B may have a size and shape configured to define the size and shape of a ground plane extension 38.

By way of example and not limitation, the first void 52A and the second void 52B may be formed using a conventional mask and etch technique. In other words, a mask layer (not shown) may be deposited over the first major surface 27A and the second major surface 27B of the layer of dielectric material 26. The mask layer may be patterned to remove portions of the mask layer overlying the regions on the layer of dielectric material 26 at which it is desired to form the first void 52A and the second void 52B. The layer of dielectric material 26 then may be etched (isotropically or anisotropically) through the patterned mask layer using conventional wet or dry (e.g., plasma) etching techniques known in the art. The mask layers then may be removed from the layer of dielectric material 26 after forming the first void 52A and the second void 52B in the layer of dielectric material 26.

In additional methods, a laser beam emitted from a laser device may be directed at the regions on the layer of dielectric material 26 at which it is desired to form the first void 52A and the second void 52B and caused to ablate the underlying regions of the layer of dielectric material 26. Furthermore, if the dimensions of the first void 52A and the second void 52B are sufficiently large, conventional mechanical drilling and/or milling processes may be used for forming the first void 52A and the second void 52B in the layer of dielectric material 26.

Figure 3C:
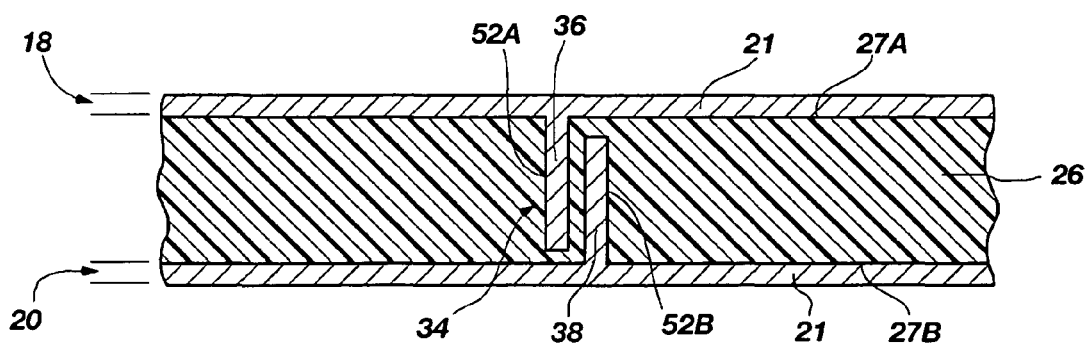

Referring to FIG. 3C, after forming the first void 52A and the second void 52B in the layer of dielectric material 26, the first void 52A and the second void 52B each may be substantially filled with a conductive material (such as, for example, copper, aluminum, silver, gold, or any other conductive metal or conductive metal alloy) to form a power plane extension 36 and a ground plane extension 38 of a noise suppression structure 34. While only one noise suppression structure 34 is shown in FIGS. 3A-3D, it is understood that a plurality of noise suppression structures 34 may be formed substantially simultaneously in the manners described herein.

In some methods, the first void 52A and the second void 52B in the layer of dielectric material 26 may be substantially filled with a conductive material while substantially simultaneously forming a generally planar layer of conductive material 21 on the first major surface 27A of the layer of dielectric material 26 to define a power plane 18 and forming a generally planar layer of conductive material 21 of the second major surface 27B of the layer of dielectric material 26 to define a ground plane 20. In additional methods, the first void 52A and the second void 52B in the layer of dielectric material 26 may be substantially filled with a conductive material to form the power plane extension 36 and the ground plane extension 38, and, subsequently, a generally planar layer of conductive material 21 defining the power plane 18 may be formed over the first major surface 27A of the layer of dielectric material 26 and the power plane extension 36, and a generally planar layer of conductive material 21 defining the ground plane 20 may be formed over the second major surface 27B of the layer of dielectric material 26 and the ground plane extension 38.

By way of example and not limitation, the first void 52A and the second void 52B each may be substantially filled with a conductive material using known electrolytic, electroless, and/or immersion plating processes.

Figure 3D:
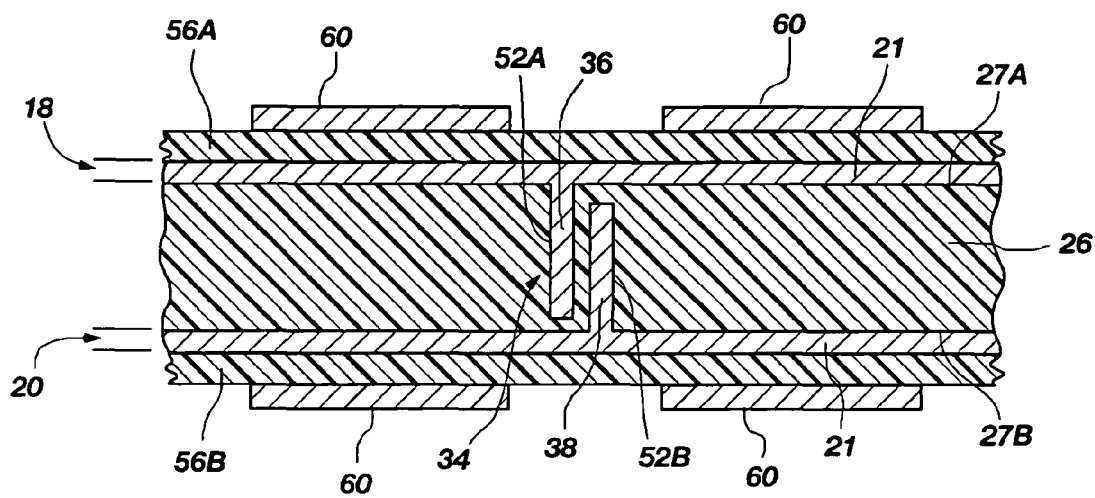

Referring to FIG. 3D, a first additional layer of dielectric material 56A may be applied over the layer of conductive material 21 defining the power plane 18, and a second additional layer of dielectric material 56B optionally may be applied over the layer of conductive material 21 defining the ground plane 20.

Electrically conductive circuitry 60 including, for example, conductive lines or traces and conductive terminals, optionally may be provided on one or both of the first additional layer of dielectric material 56A and the second additional layer of dielectric material 56B, as shown in FIG. 3D. One or more conductive vias (not shown) may extend at least partially through at least one of the layer of dielectric material 26, the first additional layer of dielectric material 56A, and the second additional layer of dielectric material 56B to provide electrical communication between elements of the electrically conductive circuitry 60 and the layer of conductive material 21 defining the power plane 18 or the layer of conductive material 21 defining the ground plane 20. In this manner, electrical power may be provided from the power plane 18 to semiconductor devices 12 (FIG. 1B) that are subsequently electrically coupled to the conductive circuitry 60, and the semiconductor devices 12 may be grounded through the ground plane 20.

The memory module shown in FIGS. 1A-1C includes a plurality of noise suppression structures 34 that each extend in a generally linear direction across the substrate 14, as represented by the dashed lines. Furthermore, in the embodiment illustrated in FIGS. 1A-1C, the noise suppression structures 34 are oriented substantially perpendicular to one another. The present invention is not so limited. In additional embodiments, noise suppression structures 34 that embody teachings of the present invention may be provided at any desired location within a substrate 14.

Figure 4:
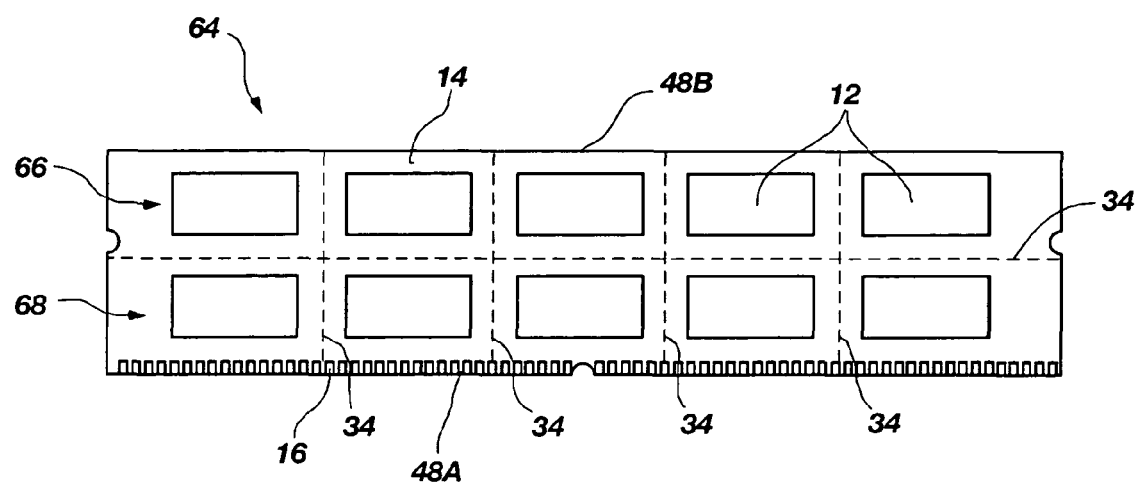
FIG. 4 is a side view of another memory module that includes a plurality of noise suppression structures configured to suppress noise in at least one of a power plane and a ground plane.

FIG. 4 illustrates another memory module 64 that embodies teachings of the present invention. The memory module 64 is similar to the memory module 10 previously described herein in relation to FIGS. 1A-1C, and includes a plurality of semiconductor devices 12 structurally and electrically coupled to a substrate 14. One or both sides of the memory module 64, however, may include a first row 66 of semiconductor devices 12 and a second row 68 of semiconductor devices 12. The dashed lines represent the location of noise suppression structures 34 within the substrate 14. As seen in FIG. 4, one noise suppression structure 34 may extend substantially across the substrate 14 between the first row 66 of semiconductor devices 12 and the second row 68 of semiconductor devices 12, while other noise suppression structures 34 may each extend substantially across the substrate 14 between adjacent semiconductor devices 12 in the first row 66 and between adjacent semiconductor devices 12 in the second row 68.

In additional embodiments, a memory module may include any number of semiconductor devices 12 structurally and electrically coupled to a substrate 14, and semiconductor devices 12 may be mounted on the substrate 14 in any desired pattern or configuration. Noise suppression structures 34 may be provided within the substrate 14 at any selected location so as to selectively electrically isolate at least one of the semiconductor devices 12 from other semiconductor devices 12 of the memory module. Furthermore, while the noise suppression structures 34 of the memory module 10 previously described in relation to FIGS. 1A-1C and the memory module 64 previously described in relation to FIG. 4 have a generally linear configuration (when viewing a major surface of the substrate 14, as in FIG. 1A and FIG. 4), the invention is not so limited. In yet additional embodiments, the noise suppression structures 34 may extend through the substrate 14 along a curved or curvilinear path. In other words, the noise suppression structures 34 may have a generally curved or curvilinear configuration (when viewing a major surface of the substrate 14, as in FIG. 1A and FIG. 4). In such embodiments, a noise suppression structure 34 in a substrate 14 may be configured to at least partially surround a semiconductor device 12 or any other electrical component that is configured to draw power from, or to supply power to, the power plane 18 and ground plane 20 of the substrate 14.

One or more noise suppression structures 34 as described herein may be used in any substrate that includes a power plane 18 and a ground plane 20, and are not limited to use in substrates 14 associated with memory modules, such as the memory module 10 and the memory module 64 previously described herein. As another example, noise suppression structures 34 may be used in a substrate comprising a printed circuit board configured as a motherboard for a computer system.

Figure 5:
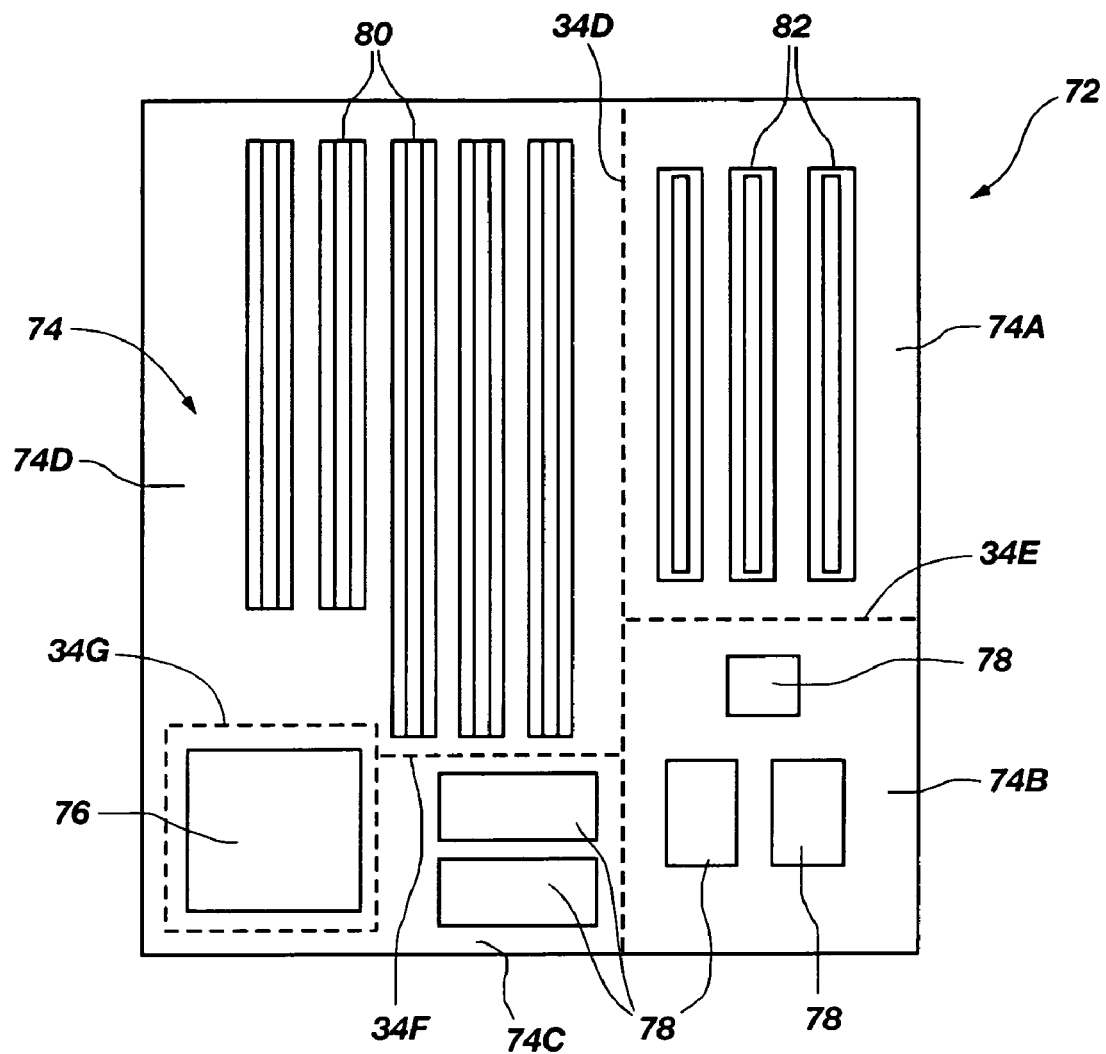
FIG. 5 is a top view of a motherboard for a computer system that includes a printed circuit board having a plurality of noise suppression structures configured to suppress noise in at least one of a power plane and a ground plane.

A simplified diagram of a motherboard 72 of a computer system that embodies teachings of the present invention is shown in FIG. 5. The motherboard 72 may include a substrate 74, which may have a configuration similar to that of the substrate 14 previously described herein in relation to FIG. 1B. With combined reference to FIG. 5 and FIG. 1B, the substrate 74 may include a power plane 18 and a ground plane 20, each of which may include a substantially planar layer of conductive material 21. The substrate 74 may further include one or more signal planes, each of which may include a plurality of generally laterally extending conductive signal lines or traces 28, and a plurality of conductive pads or terminals 30. For example, the substrate 14 may include a first surface signal plane 22A disposed adjacent a first major surface 15A of the substrate 14, a second surface signal plane 22B disposed adjacent a second major surface 15B of the substrate 15, a first internal signal plane 24A disposed between the power plane 18 and the ground plane 20, and a second internal signal plane 24B disposed between the power plane 18 and the ground plane 20. A dielectric material 26 may be disposed between each of these planes so as to substantially electrically isolate each of these planes from the others. By way of example and not limitation, the dielectric material 26 may include FR-4, FR-5, polyimide, bismaleimide triazine, or any other dielectric material suitable for use in a printed circuit board.

Referring to FIG. 5, a plurality of electrical components may be mounted on one or both major surfaces of the substrate 74. For example, such electrical components may include a central processing unit (CPU), a plurality of semiconductor devices 78 (which may include, for example, electronic signal processing devices and/or memory devices), input/output connectors, sockets, or slots such as, for example, expansion slots 80 (which may include, for example, PCI slots, ISA slots, AGP slots, or slots or connectors configured pursuant to various other industry standards), and a plurality of resident memory sockets or slots 82.

The expansion slots 80 may be configured to provide communication between the input, output, and peripheral devices (not shown) of a computer system. Such devices may include, for example, a monitor, keyboard, printer, scanner, mouse, modem, network card, etc. Such devices may be electrically coupled to the motherboard 72 by inserting an add-on card (not shown) into one of the expansion slots 80 and connecting the device to the add-on card. The add-on cards typically have independent circuitry and semiconductor devices associated therewith and are adapted to interact with the motherboard 72 such that the CPU 76 may process signals received from the add-on card and provide signals to the add-on card for control of the associated device. Alternatively, the motherboard 72 may have many, if not all, of the basic peripheral connections built-in so that such add-on cards are not required.

The memory slots 82 each are configured to structurally and electrically couple a memory module (such as, for example, the memory module 10 and the memory module 64 previously described herein) to the motherboard 72.

The substrate 74 of the motherboard 72 may further include one or more noise suppression structures 34, as previously described herein in relation to FIGS. 1B and 1C. By way of example and not limitation, the substrate 74 may include a first noise suppression structure 34D, a second noise suppression structure 34E, a third noise suppression structure 34F, and a fourth noise suppression structure 34G. The noise suppression structures 34D-34G may be selectively located and configured to generally isolate various regions of the substrate 74 from electrical noise propagating through at least one of the power plane 18 and a ground plane 20 that originates in other regions of the substrate 74. Such noise may include, for example, simultaneous switching noise (SSN).

For example, a first region 74A and a second region 74B of the substrate 74 each may be generally isolated from power plane 18 and ground plane 20 noise, originating in other regions of the substrate 74, by the first noise suppression structure 34D and the second noise suppression structure 34E, as shown in FIG. 5. Similarly, a third region 74C and a fourth region 74D of the substrate 74 each may be generally isolated from power plane 18 and ground plane 20 noise, originating in other regions of the substrate 74, by the first noise suppression structure 34D, the third noise suppression structure 34F, and the fourth noise suppression structure 34G. Furthermore, the fourth noise suppression structure 34G may be configured to substantially surround a region of the substrate 74 to which the CPU 76 is structurally and electrically coupled, thereby generally isolating this region of the substrate 74 and the CPU 76 mounted thereon from power plane 18 and ground plane 20 noise, originating in other regions of the substrate 74.

In some embodiments, not all electrical components (such as, for example, the CPU 76, semiconductor devices 78, expansion slots 80, and memory slots 82) mounted to the substrate 74 may generate noise, or problematic levels of noise, in the power plane 18 and the ground plane 20 of the substrate 74. Therefore, in some embodiments, one or more noise suppression structures 34 may be configured to at least partially surround one or more selected regions of the substrate 74 to which electrical components that generate such noise are electrically coupled. In this manner, the other regions of the substrate 74 may be generally isolated from power plane 18 and ground plane 20 noise, originating in such problematic regions of the substrate 74, by the noise suppression structures 34.

Furthermore, not all electrical components mounted to the substrate 74 may be susceptible to malfunction due to noise in the power plane 18 and the ground plane 20 of the substrate 74. Therefore, in some embodiments, one or more noise suppression structures 34 may be configured to at least partially surround one or more selected regions of the substrate 74 to which are mounted one or more components or devices that are susceptible to malfunction due to noise in the power plane 18 and the ground plane 20 of the substrate 74. In this manner, such susceptible regions of the substrate 74 may be generally isolated from power plane 18 and ground plane 20 noise, originating in other regions of the substrate 74, by the noise suppression structures 34.

Figure 6:
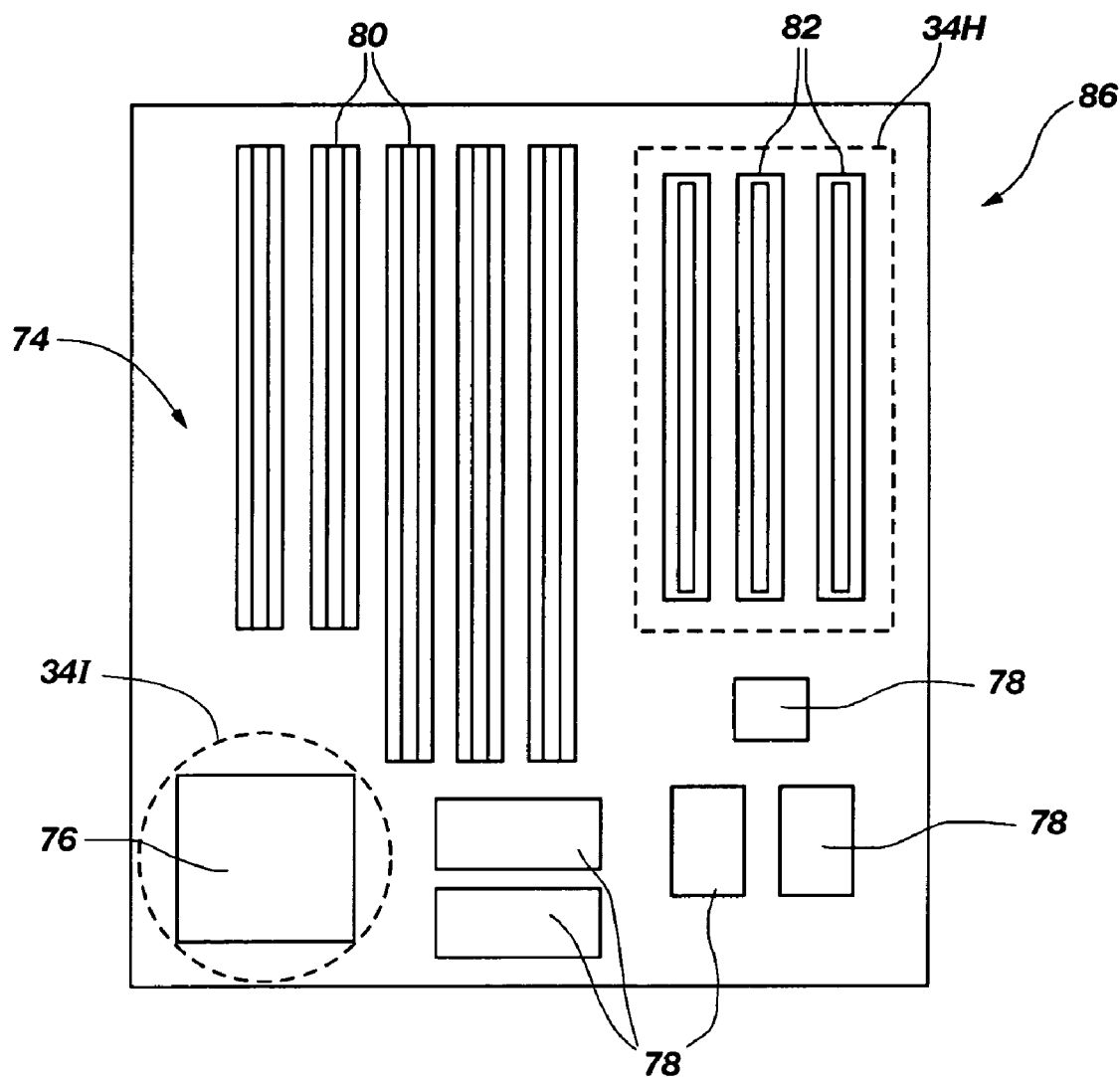
FIG. 6 is a top view of another motherboard for a computer system that includes a printed circuit board having a plurality of noise suppression structures selectively located and configured to suppress noise in at least one of a power plane and a ground plane.

FIG. 6 illustrates another motherboard 86 that is substantially similar to the motherboard 72 previously described herein with reference to FIG. 5, and may include a CPU 76, semiconductor devices 78, expansion slots 80, and memory slots 82 mounted to a substrate 74. By way of example and not limitation, memory modules (such as the memory modules 10, 64 previously described herein) that may be coupled to the memory slots 82 may be relatively susceptible to power plane 18 and ground plane 20 noise. Therefore, the motherboard 86 may include a noise suppression structure 34H that at least partially surrounds the region of the substrate 74 that includes the memory slots 82 to which such memory modules are structurally and electrically coupled. As another example, the CPU 76 may generate undesirable or problematic noise in the power plane 18 and ground plane 20 of the substrate 74. Therefore, the motherboard 86 may include a noise suppression structure 34I that at least partially surrounds the region of the substrate 74 that includes the CPU 76.

As shown in FIG. 6, the noise suppression structure 34I may extend in a generally circular direction circumferentially about at least a portion of the CPU 76. In such a configuration, the power plane extension 36 and the ground plane extension 38 of the noise suppression structure 34I may have a generally hollow cylindrical shape. Furthermore, it is not necessary that the noise suppression structure 34I continuously circumscribe the entire CPU. In additional embodiments, the noise suppression structure 34I may include a plurality of disjointed noise suppression structures (not shown) having gaps therebetween, each of which only partially surrounds the CPU 76. Such disjointed noise suppression structures may be disposed along a circle disposed about the CPU 76, and the disjointed noise suppression structures may be disposed along about 60% or more of the circumference of such circle.

The present invention is not limited to memory modules (such as, for example, the memory modules 10, 64 previously described herein) and motherboards of computer systems (such as, for example, the motherboards 72, 86 previously described herein) as described herein, but rather may include any electronic device or system that has a substrate including at least one power plane 18 and at least one ground plane 20. Moreover, substrates that have a power plane 18 and a ground plane 20 are not limited to printed circuit boards. Flexible multi-layer tape-like substrates may include conductive power planes 18 and ground planes 20, and also may embody teachings of the present invention.

Figure 7:
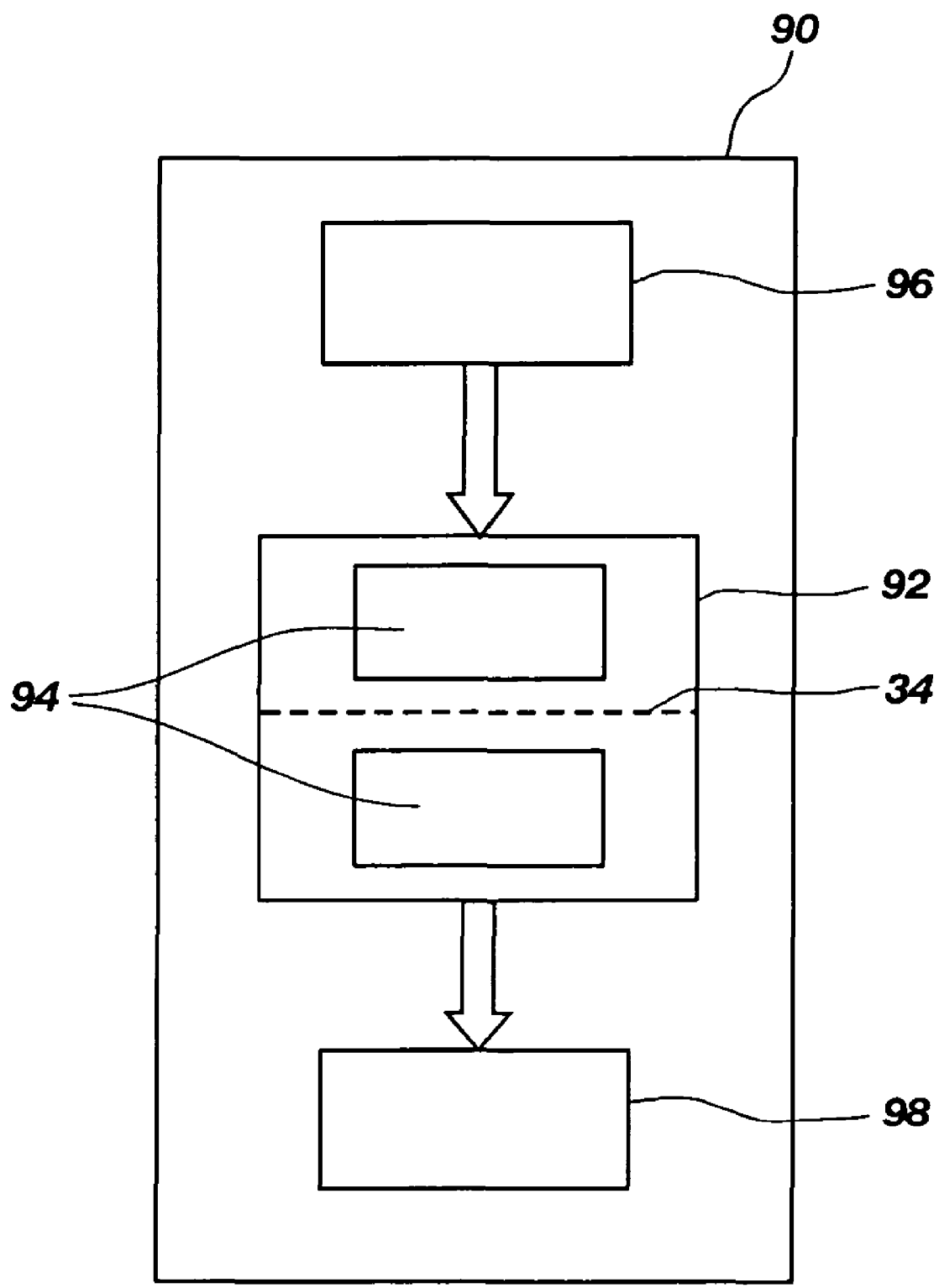
FIG. 7 is a schematic diagram of a system that embodies teachings of the present invention.

A system 90 that embodies teachings of the present invention is represented schematically in FIG. 7. By way of example and not limitation, the system 90 may include a computer system (e.g., desktop computer system, laptop computer system, handheld computer system, network server or any component of a computer system, including, for example, a central processing unit, video card, network card, external or internal hard drive, flash memory drive, compact disc (CD) drive, or digital versatile disc (DVD) drive), television, monitor, CD or DVD player, portable music player, cable or satellite receiver, or any other electronic device.

The system 90 may include a substrate 92 having a power plane 18 (not shown in FIG. 7), a ground plane 20 (not shown in FIG. 7), and one or more noise suppression structures, such as, for example, the noise suppression structure 34 previously described in relation to FIGS. 1A-1C. The system 90 may further include at least two electronic components 94 structurally and electrically coupled to the substrate 92. For example, each of the electronic components 94 may include a semiconductor device, such as, for example, a microprocessor device or a memory device. In one embodiment, one electronic component 94 may include a microprocessor device and one electronic component 94 may include a memory device. Furthermore, at least one noise suppression structure 34 may be located within the substrate 92, and oriented and configured so as to electrically isolate at least one of the electronic components 94 from at least another electronic component 94 and to suppress simultaneous switching noise (SSN). In other words, the noise suppression structure 34 may suppress electrical waves propagating through at least one of the power plane 18 and the ground plane 20 between the electronic components 94. While the substrate 92 is illustrated schematically in FIG. 7 as having one noise suppression structure 34 disposed between two electrical components 94, in additional embodiments, the substrate 92 may include any number of electrical components 94 and noise suppression structures 34.

The system 90 may also include one or more input devices 96, and one or more output devices 98. By way of example, the input device 96 may include one or more of a keyboard or keypad, touchpad, mouse (or other pointing device), or any other means for imputing information to the system 90 by a user, and the output device 98 may include one or more of a display screen, monitor, printer, audio signal output jack, or any other means for outputting information perceptible to a user.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A substrate for structurally and electrically coupling together components of an electronic device or system, the substrate comprising:

at least one power plane;
at least one ground plane;
at least one noise suppression structure disposed between the at least one power plane and the at least one ground plane, the at least one noise suppression structure comprising:
a power plane extension extending from the at least one power plane generally toward the at least one ground plane; and
a ground plane extension extending from the at least one ground plane generally toward the at least one power plane; and
at least one semiconductor device structurally and electrically coupled to a first region of the substrate, the power plane extension and the ground plane extension of the at least one noise suppression structure extending parallel to one another at least substantially continuously along a path at least partially surrounding the first region of the substrate and at least partially disposed between the first region of the substrate and a second region of the substrate;
wherein the at least one noise suppression structure is configured to suppress electrical waves propagating through at least one of the at least one power plane and the at least one ground plane between the first region of the substrate and the second region of the substrate.

2. The substrate of claim 1, further comprising at least one additional semiconductor device structurally and electrically coupled to the second region of the substrate remote from the first region.

3. The substrate of claim 1, wherein the ground plane extension is separated from the power plane extension by a distance that is less than a distance separating the at least one ground plane from the at least one power plane.

4. The substrate of claim 3, wherein the power plane extension and the ground plane extension each comprise a generally hollow cylindrical shape.

5. The substrate of claim 1, wherein the power plane extension and the ground plane extension each comprise a substantially planar conductive member.

6. The substrate of claim 5, wherein the substantially planar conductive member of the power plane extension is oriented substantially parallel to the substantially planar conductive member of the ground plane extension.

7. The substrate of claim 5, wherein the substantially planar conductive member of the power plane extension is separated from the substantially planar conductive member of the ground plane extension by a distance in a range extending from about 0.01 millimeter to about 0.15 millimeter.

8. The substrate of claim 5, wherein the substantially planar conductive member of the power plane extension has a thickness substantially equal to a thickness of the at least one power plane, and wherein the substantially planar conductive member of the ground plane extension has a thickness substantially equal to a thickness of the at least one ground plane.

9. The substrate of claim 5, wherein a thickness of the substantially planar conductive member of the power plane extension is substantially equal to a thickness of the substantially planar conductive member of the ground plane extension.

10. The substrate of claim 9, wherein the thickness of the substantially planar conductive member of the power plane extension and the thickness of the substantially planar conductive member of the ground plane extension each have a thickness in a range extending from about 0.01 millimeter to about 0.15 millimeter.

11. The substrate of claim 5, wherein the power plane extension is oriented substantially perpendicular to the at least one power plane, and wherein the ground plane extension is oriented substantially perpendicular to the at least one ground plane.

12. The substrate of claim 1, wherein a shortest distance between the power plane extension and the at least one ground plane is less than about 0.15 millimeter, and wherein a shortest distance between the ground plane extension and the at least one power plane is less than about 0.15 millimeter.

13. The substrate of claim 1, wherein the substrate comprises a printed circuit board.

14. The substrate of claim 1, wherein the at least one noise suppression structure comprises a plurality of noise suppression structures, at least one noise suppression structure of the plurality being configured to exhibit at least one noise suppression characteristic that differs from at least one noise suppression characteristic exhibited by at least one other noise suppression structure of the plurality.

15. A substrate for structurally and electrically coupling together components of an electronic device or system, the substrate comprising:
    at least one power plane;
    at least one ground plane separated from the at least one power plane by a distance and oriented generally parallel thereto;
    a dielectric material disposed between at least a portion of the at least one power plane and at least a portion of the at least one ground plane;
    a power plane extension extending from the at least one power plane generally toward the at least one ground plane;
    a ground plane extension extending from the at least one ground plane generally toward the at least one power plane, the ground plane extension being separated from the power plane extension by a distance that is less than the distance separating the at least one ground plane from the at least one power plane; and
    at least one semiconductor device structurally and electrically coupled to a first region of the substrate, the power plane extension and the ground plane extension extending parallel to one another at least substantially continuously along a path at least partially surrounding the first region of the substrate and at least partially disposed between the first region of the substrate and a second region of the substrate the second region of the substrate being laterally separated from the first region of the substrate.

16. The substrate of claim 15, wherein the ground plane extension is separated from the power plane extension by a distance that is less than a distance separating the at least one ground plane from the at least one power plane.

17. The substrate of claim 15, wherein the power plane extension and the ground plane extension each comprise a generally hollow cylindrical shape.

18. The substrate of claim 15, wherein the power plane extension and the ground plane extension each comprise a substantially planar conductive member.

19. The substrate of claim 18, wherein the substantially planar conductive member of the power plane extension is separated from the substantially planar conductive member of the ground plane extension by a distance in a range extending from about 0.01 millimeters to about 0.15 millimeters.

20. The substrate of claim 18, wherein a thickness of the substantially planar conductive member of the power plane extension is substantially equal to a thickness of the substantially planar conductive member of the ground plane extension.

21. The substrate of claim 15, wherein a shortest distance between the power plane extension and the at least one ground plane is less than about 0.15 millimeter, and wherein a shortest distance between the ground plane extension and the at least one power plane is less than about 0.15 millimeter.

22. The substrate of claim 15, wherein the substrate further comprises a plurality of noise suppression structures, at least one noise suppression structure of the plurality being configured to exhibit at least one noise suppression characteristic that differs from at least one noise suppression characteristic exhibited by at least one other noise suppression structure of the plurality.

23. An electronic device assembly comprising:
    a substantially planar substrate comprising:
        at least one power plane;
        at least one ground plane; and
        at least one noise suppression structure disposed between the at least one power plane and the at least one ground plane, the at least one noise suppression structure configured to suppress electrical waves propagating through at least one of the at least one power plane and the at least one ground plane, the at least one noise suppression structure comprising:
            a power plane extension extending from the at least one power plane toward the at least one ground plane; and
            a ground plane extension extending from the at least one ground plane toward the at least one power plane;
    at least two semiconductor devices structurally and electrically coupled to the substantially planar substrate, the power plane extension and the ground plane extension of the at least one noise suppression structure extending parallel to one another at least substantially continuously along a path located between and laterally separating the at least two semiconductor devices on the substantially planar substrate.

24. The electronic device assembly of claim 23, wherein the ground plane extension is separated from the power plane extension by a distance that is less than a distance separating the at least one ground plane from the at least one power plane.

25. The electronic device assembly of claim 23, wherein the electronic device assembly comprises a memory module or a motherboard of a computer system.

26. The electronic device assembly of claim 23, wherein the at least two semiconductor devices comprise at least one microprocessor device and at least one memory module.

27. The electronic device assembly of claim 23, wherein the at least one noise suppression structure at least partially surrounds at least one of the at least two semiconductor devices.

28. The electronic device assembly of claim 23, wherein the power plane extension and the ground plane extension each comprise a generally hollow cylindrical shape.

29. The electronic device assembly of claim 26, wherein the power plane extension and the ground plane extension each comprise a substantially planar conductive member.

30. The electronic device assembly of claim 29, wherein the substantially planar conductive member of the power plane extension is oriented substantially parallel to the substantially planar conductive member of the ground plane extension.

31. The electronic device assembly of claim 30, wherein the substantially planar conductive member of the power plane extension is separated from the substantially planar conductive member of the ground plane extension by a distance in a range extending from about 0.01 millimeter to about 0.15 millimeter.

32. The electronic device assembly of claim 29, wherein a thickness of the substantially planar conductive member of the power plane extension is substantially equal to a thickness of the substantially planar conductive member of the ground plane extension.

33. The electronic device assembly of claim 23, wherein a shortest distance between the power plane extension and the at least one ground plane is less than about 0.15 millimeter, and wherein a shortest distance between the ground plane extension and the at least one power plane is less than about 0.15 millimeter.

34. The electronic device assembly of claim 23, wherein the at least one noise suppression structure comprises a plurality of noise suppression structures, at least one noise suppression structure of the plurality being configured to exhibit at least one noise suppression characteristic that differs from at least one noise suppression characteristic exhibited by at least one other noise suppression structure of the plurality.

35. A system comprising:
 a substrate comprising:
  at least one power plane;
  at least one ground plane; and
  at least one noise suppression structure disposed between the at least one power plane and the at least one ground plane, the at least one noise suppression structure comprising:
   a power plane extension extending from the at least one power plane toward the at least one ground plane, the power plane extension being directly electrically coupled only to the at least one power plane; and
   a ground plane extension extending from the at least one ground plane toward the at least one power plane, the ground plane extension being directly electrically coupled only to the at least one ground plane, the ground plane extension being disposed proximate the power plane extension; and
 at least two semiconductor devices structurally and electrically coupled to the substrate;
 wherein at least a portion of the power plane extension and at least a portion of the ground plane extension of the at least one noise suppression structure extends at least substantially continuously parallel to one another along a path located between the at least two semiconductor devices, and wherein the at least one noise suppression structure is configured to suppress electrical waves propagating through at least one of the at least one power plane and the at least one ground plane between the at least two semiconductor devices.

36. The system of claim 35, wherein the system includes one of a computer system, a component of a computer system, a television, a monitor, a CD or DVD player, a portable music player, and a cable or satellite receiver.

37. The system of claim 35, further comprising at least one input device and at least one output device.

38. The system of claim 35, wherein the at least one noise suppression structure at least partially surrounds at least one of the at least two semiconductor devices.

39. The system of claim 35, wherein the at least two semiconductor devices comprise at least one microprocessor device and at least one memory device.

* * * * *

UNITED STATES PATENT AND TRADEMARK OFFICE
CERTIFICATE OF CORRECTION

| | | |
|---|---|---|
| PATENT NO. | : 7,778,039 B2 | Page 1 of 1 |
| APPLICATION NO. | : 11/430540 | |
| DATED | : August 17, 2010 | |
| INVENTOR(S) | : Houfei Chen et al. | |

It is certified that error appears in the above-identified patent and that said Letters Patent is hereby corrected as shown below:

In column 17, line 47, in Claim 15, delete "substrate the" and insert -- substrate, the --, therefor.

In column 17, line 65, in Claim 19, delete "millimeters" and insert -- millimeter --, therefor.

In column 17, line 65, in Claim 19, delete "millimeters." and insert -- millimeter. --, therefor.

Signed and Sealed this

Twelfth Day of October, 2010

David J. Kappos
*Director of the United States Patent and Trademark Office*